(12) United States Patent
Yap et al.

(10) Patent No.: US 6,300,781 B1
(45) Date of Patent: Oct. 9, 2001

(54) RELIABLE METHOD AND APPARATUS FOR INTERFACING BETWEEN A BALL GRID ARRAY HANDLER AND A BALL GRID ARRAY TESTING SYSTEM

(75) Inventors: Liop Jin Yap; Wee Boon Tan; Chee-Keong Tan, all of Singapore (SG)

(73) Assignee: ST Assembly Test Services PTE Ltd, Singapore (SG)

( * ) Notice: Subject to any disclaimer, the term of this patent is extended or adjusted under 35 U.S.C. 154(b) by 0 days.

(21) Appl. No.: 09/182,762

(22) Filed: Oct. 30, 1998

(51) Int. Cl.[7] .................................................. G01R 31/26
(52) U.S. Cl. ........................ 324/755; 324/765; 439/71
(58) Field of Search ..................................... 324/754, 755, 324/757, 758, 765; 439/70, 71

(56) References Cited

U.S. PATENT DOCUMENTS

| | | | |
|---|---|---|---|
| 5,127,837 | 7/1992 | Shah et al. | 439/71 |
| 5,537,051 * | 7/1996 | Jalloul et al. | 324/758 |
| 5,578,870 | 11/1996 | Farnsworth et al. | 257/727 |
| 5,646,447 | 7/1997 | Ramsey et al. | 23/48 |
| 5,688,127 | 11/1997 | Staab et al. | 439/66 |
| 5,810,607 * | 9/1998 | Shih et al. | 439/66 |
| 6,046,597 * | 4/2000 | Barabi | 324/755 |
| 6,062,873 * | 5/2000 | Kato | 439/71 |

* cited by examiner

Primary Examiner—Ernest Karlsen
Assistant Examiner—Russell M. Kobert
(74) Attorney, Agent, or Firm—George O. Saile; Stephen B. Ackerman

(57) ABSTRACT

An arrangement of three plates where the top plate interfaces with the BGA device, the center plate has a structure of channels or openings which is matched with the size and ball pitch of the BGA device that is being handled while the bottom plate interfaces with the tester or target plate. A plurality of center plates is provided to match and equal the plurality of BGA devices that is handled in the BGA testing or BGA semiconductor-manufacturing environment.

9 Claims, 6 Drawing Sheets

US 6,300,781 B1

RELIABLE METHOD AND APPARATUS FOR INTERFACING BETWEEN A BALL GRID ARRAY HANDLER AND A BALL GRID ARRAY TESTING SYSTEM

FIELD OF THE INVENTION

The present invention relates to the field of semiconductor device handling, and more specifically to sockets for the insertion of surface mounted, high pin count semiconductor packages, and more particularly to test and burn in sockets for Ball Grid Array (BGA) integrated circuit packages.

DESCRIPTION OF THE PRIOR ART

Surface mounted, high pin count integrated circuit packages have been dominated by Quad Flat Packs (QFP's) with various pin configurations. These packages have closely spaced leads for making electrical connections distributed along the four edges of the flat package. These packages have become limited by being confined to the edges of the flat package even though the pin to pin spacing is small. To address this limitation, a new package, a Ball Grid Array (BGA) is not so confined because the electrical contact points are distributed over the entire bottom surface of the package. More contact points can thus be located with greater spacing between the contact points than with the QFP's. These contacts are solder balls that facilitate flow soldering of the package onto a printed circuit board. BGA's are therefore popular alternatives the QFP's.

Sockets that accept BGA's are required for device testing, burn-in, re-programming and at times for production use where the integrated circuit must be replaced. Currently, in order to test a BGA device, the contactor elements of the BGA device are inserted into a contactor plate having a plurality of sockets. The contactor plate is coupled to a Device Under Test (DUT) board, which is coupled to a tester. In order to test the BGA device, the tester sends electrical signals to and receives electrical signals from the BGA device via the electrical paths provided by the contactor plate and the DUT board.

While current contactor plates do work, there exist several problems with the contactor plates.

First, many current contactor plates consist of a plurality of sockets for receiving the contactor elements of the BGA device.

Second, certain contactor plates can only be used for certain types of testing equipment. As such, different contactor plates are required for different types of testing equipment.

Third, contactor plates only accommodate BGA devices having a particular array type or a particular ball pitch. This requires that there is a different contactor plate for different size BGA packages.

Therefore, the need exists to provide a contactor plate that provides reliable electrical contacts for testing BGA devices. The contactor plate must be capable of being used on different types of testing and handling equipment. The contactor plate must also be adaptable to allow the contactor plate to handle a variety of different size BGA devices.

U.S. Pat No. 5,688,127 (Staab et al.) shows a universal contactor system of testing multiple size BGA devices on multiple types of test equipment. However, this patent does not show the exact details of the present invention.

U.S. Pat. No. 5,646,447 (Ramsey) shows a test socket for BGA. However, this reference differs from the present invention.

U.S. Pat. No. 5,578,870 (Farnsworth et al.) shows another top loading test socket for BGA's.

U.S. Pat. No. 5,127,837 (Shah et al.) discloses an electrical connector and Integrated circuit tester with a wadded wire plunger.

SUMMARY OF THE INVENTION

In accordance with the present invention, it is an objective of the present invention to provide an improved contactor system and method for testing BGA devices.

Another objective of the present invention is to provide an improved contactor system and method that can be used to test BGA devices of various sizes.

Another objective of the present invention is to provide an improved contactor system and method that can be used for testing BGA devices on multiple types of testing equipment.

Another objective of the present invention is to provide an improved contactor system and method that provides a reliable electrical connection for testing BGA devices.

In accordance with the objectives of the present invention a BGA interface socket is designed that accommodates various size BGA packages.

The number of contact points and the pitch between the contact points of a specific BGA device is a given and is fixed. Also fixed is the array of pads or contact points on the surface of the loadboard of the BGA device tester. The present invention provides the means of quickly and reliably establishing electrical connections between these two interfaces. The interface socket of the present invention eliminates the need to use relatively expensive sockets for different sizes of BGA devices. In the present environment a socket is unique for a given BGA device size and BGA ball pitch. The interface socket of the present invention serves as an interface between the BGA semiconductor device that is being tested and the tester.

BRIEF DESCRIPTION OF THE DRAWINGS

In the accompanying drawings, forming a material part of the description, there is shown:

FIG. 1a shows a perspective view of the interface socket 10, specifically highlighting: the socket alignment plate 11 the socket base plate 12 and the socket base interface plate 13.

FIG. 1b shows a cross section view of the interface socket 10 being joined with the BGA device handler docking plate 19 of the BGA device handler.

FIG. 1c shows a cross section view of the interface socket 10 with the BGA device handler docking plate 19 of the BGA device after the interface socket 10 has been inserted into the loadboard 25.

FIG. 2a show a plan view of top of the socket alignment plate 11

FIG. 2b shows a cross section view of the socket alignment plate 11.

FIG. 3a shows a plan view of the top of the socket base plate 12

FIG. 3b shows a plan view of the bottom of the socket base plate 12

FIG. 3c shows a cross section view of the socket base plate 12

FIG. 3d shows an enlarged detail of the cross section view of the socket base plate 12.

FIG. 4a shows a plan view of the top of the socket base interface plate 13

FIG. 4b shows a cross section view of the socket interface plate 13.

DETAILED DESCRIPTION OF THE PREFERRED EMBODIMENT

Figure 1A:
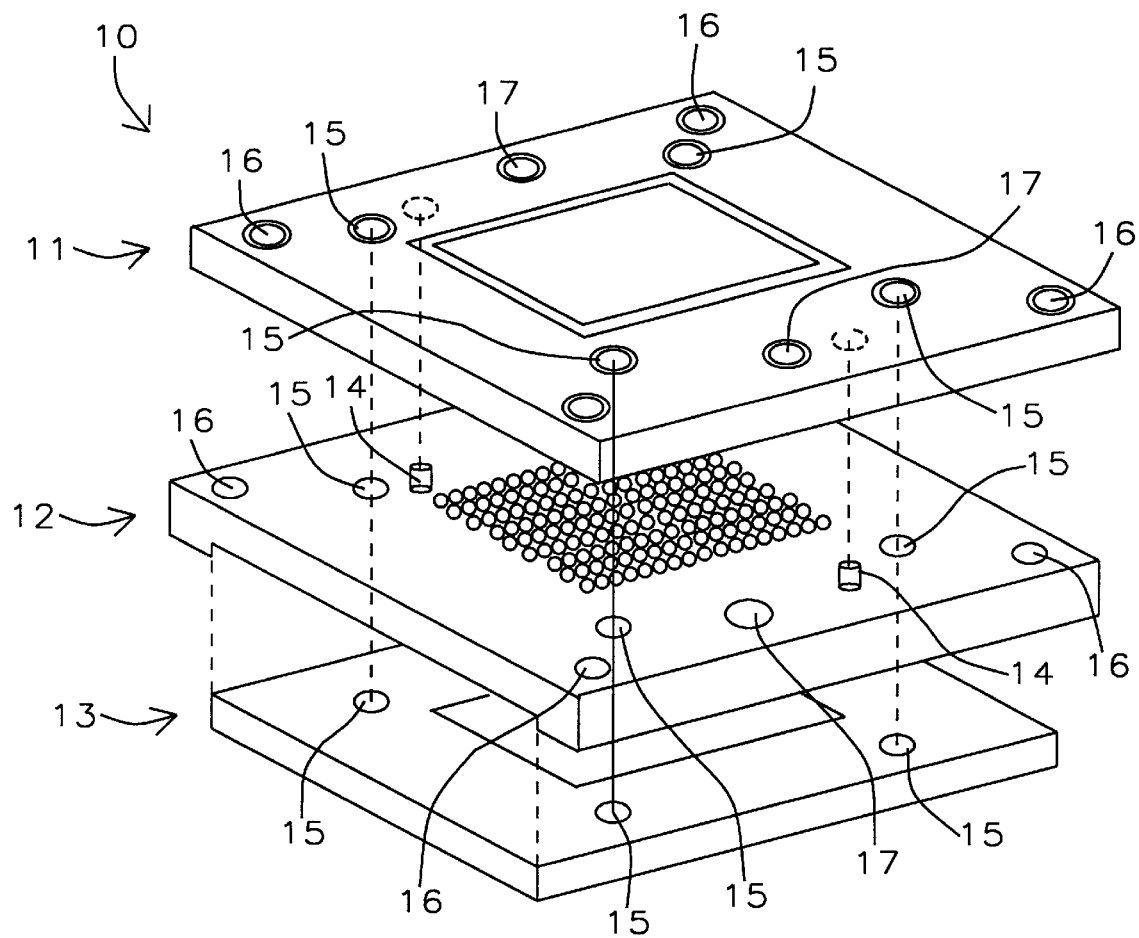
FIGS. 1a through 1c show details of the interface socket 10 of the present invention, as follows.

Turning now specifically to FIG. 1a, the three constructs which make up the interface socket 10 are shown, that is the socket alignment plate 11, the socket base plate 12 and the socket base interface plate 13.

Figure 1B:
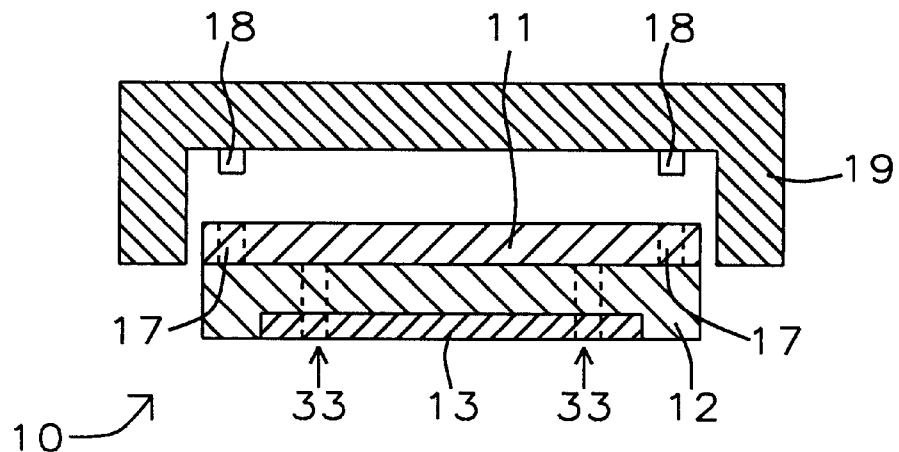
Figure 1C:
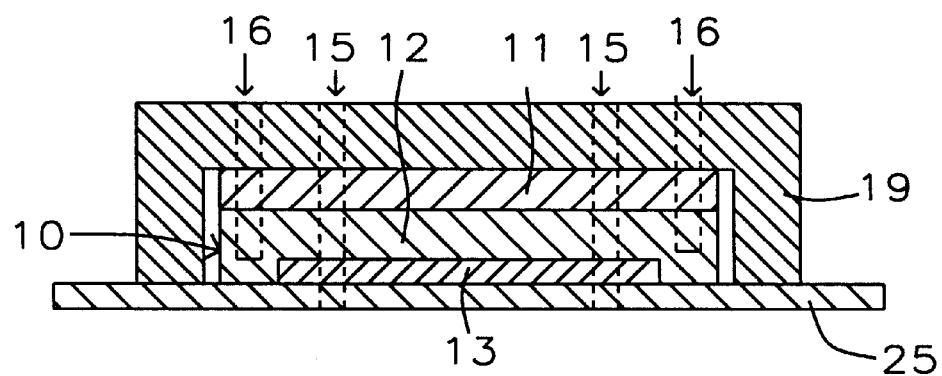
Figure 5:
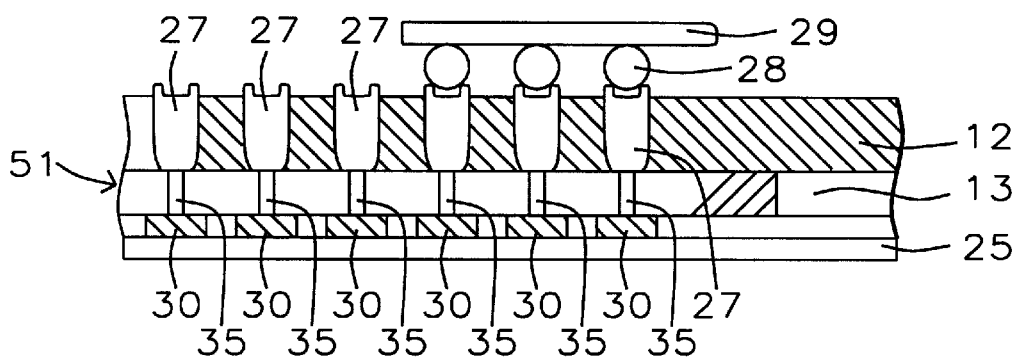
FIG. 5 shows a cross section view of the interface between the BGA device 29, the socket base plate 12, the socket base interface plate 13 and the tester loadboard 25.

The functions and objectives of the three plates within the interface socket can be described as follows:

the socket alignment plate 11 aligns the interface socket 10 with the BGA device handler docking plate 19, FIGS. 1b, 1c the socket base plate 12 forms the base into which the BGA device is inserted within the interface socket 10 and which as such serves as the electrical adapter between the balls of the BGA device 29 FIG. 5 and the loadboard 25, FIG. 1c the socket interface plate 13 establishes an electrical and mechanical interface between the interface socket 10 and the loadboard 25 FIG. 1a.

The functions of the various alignment screws will be explained here.

Guide pins 14 serve to align the alignment plate 11 with the socket base plate 12.

The interface socket 10 is to be inserted between the docking plate 19 of the BGA device handler and the loadboard 25 of the tester. The openings 15 are used to tightly assemble the BGA device handler plate 19, the three plates of the interface socket 10 and the loadboard 25.

The four screws inserted through openings 16 are used to tightly assemble the BGA device handler plate 19 with the socket alignment plate 11 and the socket base plate 12 of the interface socket 10.

The openings 17 serve as alignment guides that align the interface socket 10 of the present invention with the docking plate 19 of the BGA device handler. Openings 17 are for this purpose provided in the socket alignment plate 11 and the socket base plate 12.

Figure 2A:
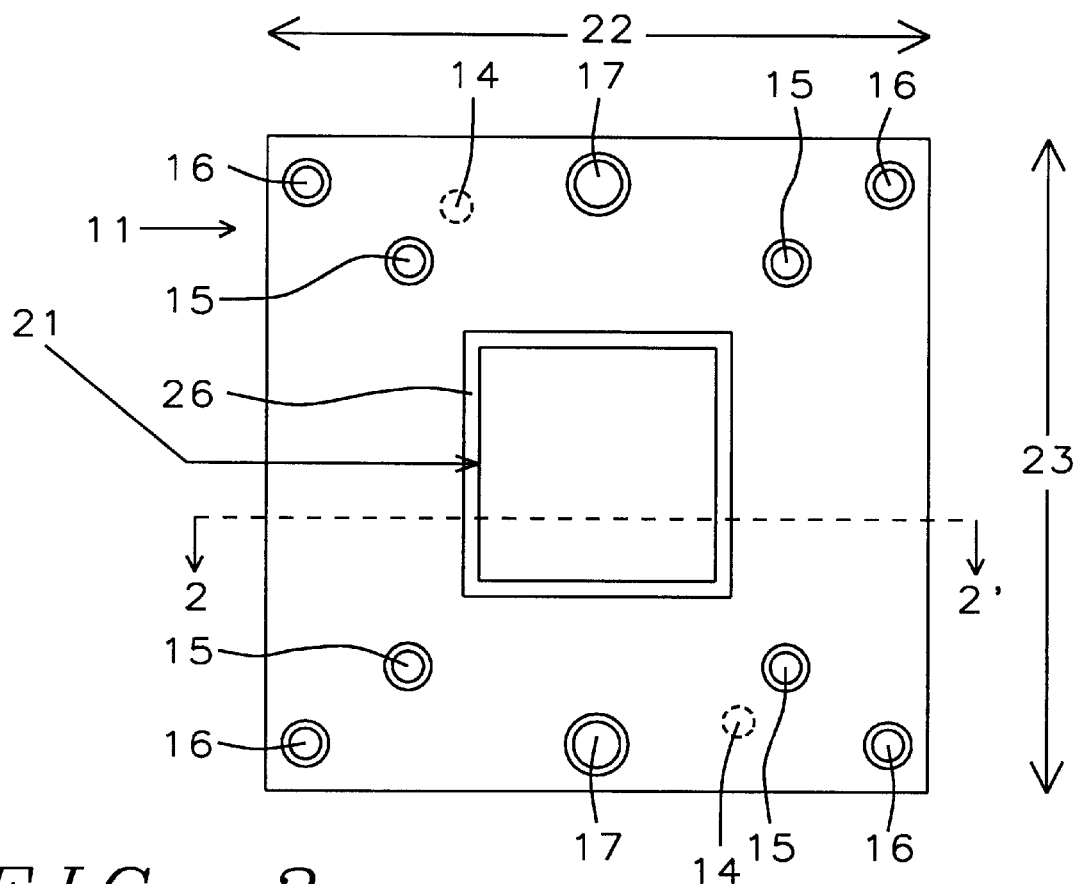
FIGS. 2a and 2b show details of the socket alignment plate 11, as follows.
Figure 3A:
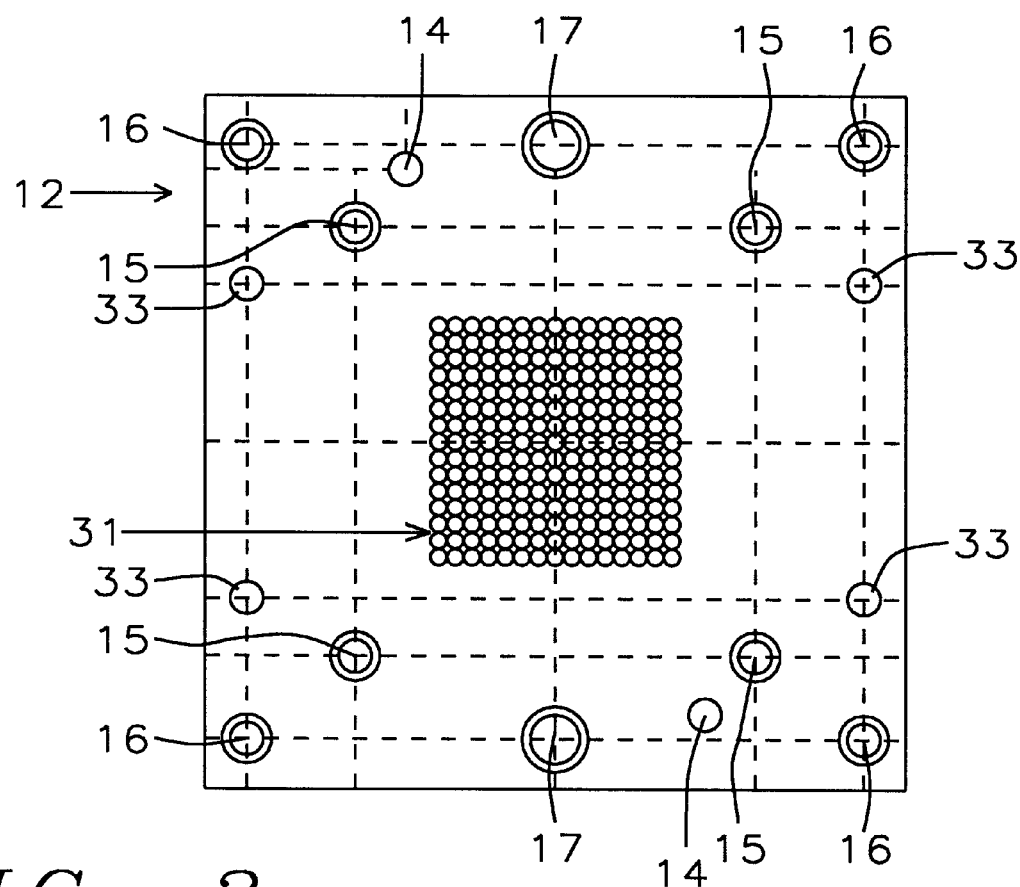
FIGS. 3a through 3d show details of the socket base plate 12, as follows.
Figure 3B:
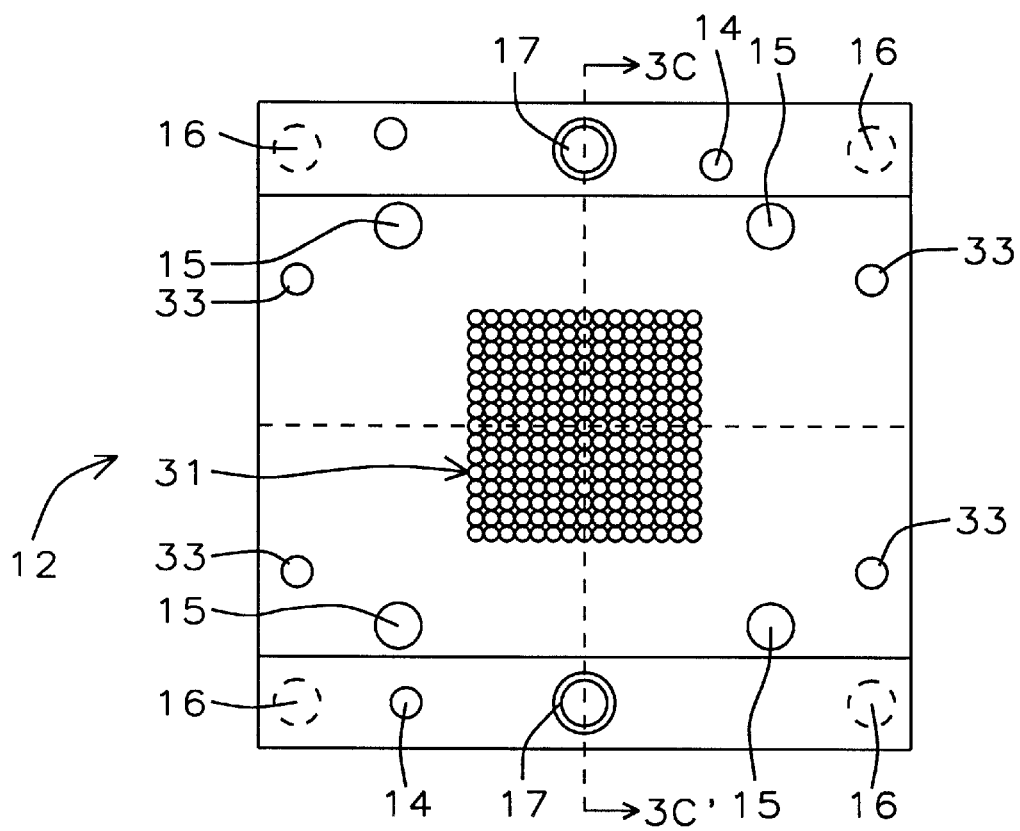

FIG. 1b shows how the interface socket 10 of the present invention is assembled before the interfaces socket 10 makes contact with the tester loadboard 25. The socket base plate 12, which in size overlaps the socket base interface plate 13, is overlaid on top of the socket interface plate 13. The socket base plate 12 is screwed to the socket base interface plate by means of four M3 screws that are inserted through openings 33 in both the socket base interface plate 13 (FIG. 4a) and the socket base plate 12 (FIG. 3a and FIG. 3b) and that screw into the socket base plate 11. This assembling of the interface socket plates is facilitated by two guide pins 14 (on top of the socket base plate 12, FIG. 1a) that are inserted into openings 14 provided in the bottom of the alignment plate 11 (FIG. 2a). Guide openings 17 are used during this step for alignment purposes. The interface socket 10 is then joined with the BGA device handler plate 19 using the guide pins 18 in the docking plate 19 and the guide openings 16 within the alignment plate 11 (FIG. 2a) and the socket base plate 12 (FIG. 3a, FIG. 3b). Openings 16 do not protrude all the way through the socket base plate 12 (FIG. 3b), the four screws through openings 16 connect the interface socket 10 to the BGA device handler plate 19.

FIG. 1c shows the joining of the interface socket 10, which is loaded into the tester loadboard by means of the BGA device handler docking plate 19, with the tester loadboard 25. The tightly connecting of this assemblage to the loadboard 25 is done by screws inserted through openings 15 that are provided in all three plates of the interface socket.

FIG. 2a shows a top plan view of the device alignment plate 11. The function of the device alignment plate 11 is to align the interface socket 10 with the BGA device handler docking plate 19.The cutout or opening 21 in the device alignment plate 11 can vary in size to adopt to different BGA device dimensions. Typical cutout sizes are 23×23 mm. to 35×35 mm. The present invention however is not limited to or restricted by these sizes. It is to be noted that the opening 21 in the device alignment plate 11 has chamfered sides 26 for ease of insertion of the semiconductor device into the opening 21. The dimensions of the device alignment plate 11 are indicated as 22 for the plate width and 23 for the plate depth. A typical dimension for the plate width 22 is 60 mm. while the plate depth 23 typically is 70 mm. The present invention however is not limited to or restricted by these dimensions. Shown in FIG. 2a are the two guide pins 14 together with the 2 openings for the alignment guides 17. The guide pins 14 are indicated as being on the bottom surface (not shown) of the socket alignment plate, see FIG. 1a for clarity. The thickness of the device alignment plate 11 is indicated as 24 FIG. 2b. A typical size of this dimension is 10 mm. but the present invention is not limited to or restricted by this dimension. Typical dimension for the guide pin 14 is 02.5 mm. but the present invention is not limited to or restricted by this dimension.

Figure 2B:
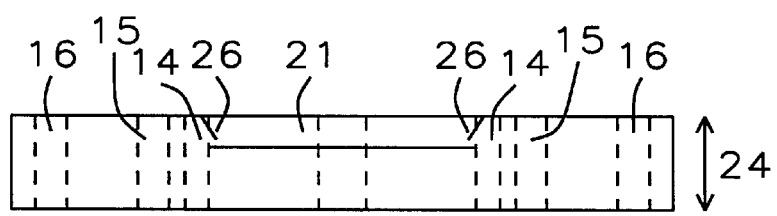

FIG. 2b shows a cross sectional view of the socket alignment plate 11 with the chamfered sides 26 of the plate opening 21.

FIG. 3a shows a top plan view of the socket base 12. The top of the socket base plate 12 is here defined as that side of the socket base plate that is facing toward the handler docking plate 19, that is away from the loadboard 25. Key to the present invention is that the array of contact points provided within the center opening 31 of the socket base plate 12 varies in number of contact points while the pitch between the contact points provided within this opening 31 remains the same. These variations in opening size are provided in order to accommodate and properly interface a BGA device tester with BGA devices of different sizes. The interface adaptation does not need to be limited to the interface between a semiconductor device handler and a semiconductor tester. Any equipment, which is used within a semiconductor manufacturing or testing environment and which must process or test BGA devices which vary in device size or ball pitch, can use the present invention for quick and reliable set up of the equipment from one BGA device type or size to another. Guide pins 14 are used for alignment between the device alignment plate 11 and the socket base plate 12.

FIG. 3b shows the bottom view of the socket base plate 12. The bottom of the socket base plate 12 is here defined as that side of the socket base plate 12 that is facing away from the handler docking plate, that is facing toward the loadboard.

Figure 3C:
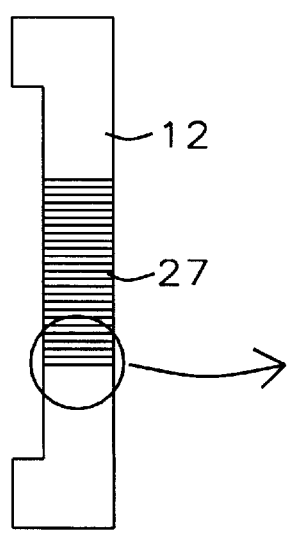

FIG. 3c shows a cross sectional view of the socket base plate 12 while

Figure 3D:
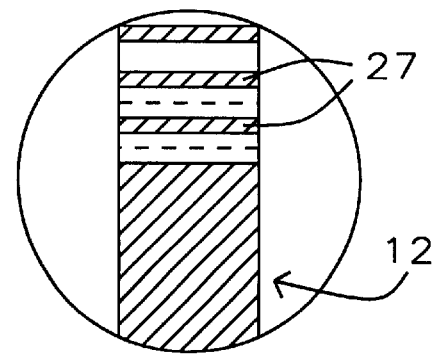

FIG. 3d shows a detailed section of the cross section view of the socket base plate 12. The cross section view, FIG. 3c, of the socket base plate 12 shows a multiplicity of electrical conductors 27 that extend through the opening 31 within the socket base plate 12. The balls or contact points of the BGA device rest on top of and are in electrical contact with the top of the electrical contacts 27. The electrical conductors 27 therefore establish an electrical path from the balls of the BGA device to the bottom surface of the socket base plate 12.

FIG. 3d shows an enlarged subsection of a cross section of the socket base plate 12. This enlarged cross section further highlights several of the electrical conductors 27.

Figure 4A:
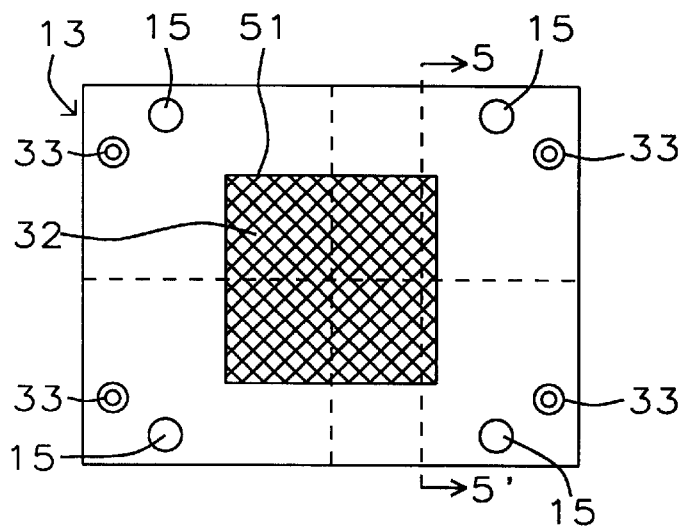
FIGS. 4a and 4b shows details of the socket base interface plate 13, as follows.

FIG. 4a shows a top view of the base interface plate 13. The purpose of the interface plate 13 is to establish an electrical and mechanical interface between the interface socket 10 and the loadboard. A cutout or opening 51 within the base interface plate 13 holds a construct of elastomer 32. Elastomer is an elastic rubberlike substance having some of the physical properties of natural rubber. As such elastomer is an insulator. By however inserting a conducting wire through the elastomer layer 32 in the direction of the Z axis, that is perpendicular to the plane of the layer of elastomer 32, electricity can flow from the top surface of the layer of elastomer 32 to the bottom surface. This concept can readily be extended to the point where multiple points on the top surface of the elastomer 32 can electrically be connected to multiple points on the bottom surface of the layer of elastomer 32. From this it follows that points of electrical contact that are present at the bottom surface of the socket base plate 12, and that are in electrical contact with the top surface of the layer of elastomer 32, can be electrically connected with points at the bottom surface of the layer of elastomer 32. Bringing the bottom surface of the elastomer 32 in electrical contact with the copper pads on the surface of the loadboard 25 and taking into account that previous discussions have indicated that the contact balls of the BGA device inserted by the BGA device handler into the interface socket 10 are in electrical contact with the bottom surface of the socket base plate 12, we may conclude that an electrical path has been established in this manner between the contact balls of the BGA device and the copper pads on the surface of the loadboard 25. The elastomer will not be the cause of any electrical shorts between these electrical paths since elastomer is an electrical insulator.

Figure 4B:
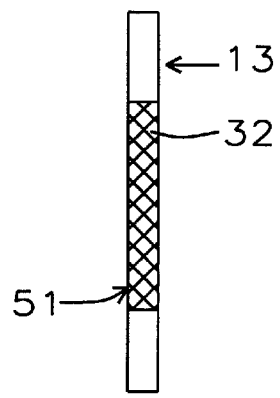

FIG. 4b shows a cross section of the base interface plate 13.

By selecting a socket base plate 12 that matches the ball configuration and ball pitch of the BGA device to be tested, and by inserting this socket base plate 12 within the interface socket 10 and mounting the interface socket 10 onto the tester, the tester has been prepared for testing a particular BGA. In so doing, the interface socket 10 of the present invention negates the need for additional requirements for special BGA test sockets.

FIG. 5 shows a detailed cross view of a path of electrical contact between the balls 28 of the BGA device 29 and the copper contact pads 30 on top of the loadboard 34. The contact balls 28 of the BGA device 29 rest within openings provided in the center of the electrical conductors 27. These electrical conductors run through the center opening 51 of the socket base plate 12 in the direction of the Z axis, that is from the BGA contact balls toward the contact pads on top of the loadboard. The electrical contacts 27 make electrical contact with a multiplicity of wires 35 within the elastomer mounted in the center opening 51 of the socket base interface plate 13. This latter multiplicity of wires 35 also runs in the direction of the Z-axis that is again from the BGA device contact balls toward the contact pads on top of the loadboard. FIG. 5 further shows a number of unused interconnects 27/35 that are adjacent to the attached semiconductor device 29. These unused interconnect pins are used for larger BGA devices and provide the universality of the interface socket of the invention. These two matching and complementary sets of electrical conductors therefore form the totality of the electrical paths from the balls of the BGA device to the contact points on top of the loadboard.

In the cross section that is shown in FIG. 5, the following concepts can be identified:

the interface socket for ball grid array integrated circuit packages that is shown in cross section in FIG. 5 provides an interface between a device handler or a device tester (plate 19, FIGS. 1b and 1c, not shown in FIG. 5) and a device load board 25 having contact pads 30 the interface socket comprises three structures, that is a top structure (not shown in FIG. 5, shown as plate 11, FIGS. 1a–1c, also shown in FIGS. 2a and 2b), a center structure 12 and a bottom structure 13 the top structure (not shown in FIG. 5, shown as plate 11 in FIGS. 1a–1c, also shown in FIGS. 2a and 2b) comprises a first opening large enough to allow a grid array package to pass through with a first multiplicity of ball contacts 28 facing the interface socket, the ball contacts 28 having points of electrical contact the center structure 12 comprises through holes through which a second multiplicity of first electrical contacts 27 extend, each first electrical contact having a first end and a second end, with the first end of the first electrical contacts 27 arranged to meet with the points of electrical contact of the contact balls 28, whereby the second multiplicity of first electrical contacts 27 is equal to or larger than the first multiplicity of ball contacts 28 the bottom structure 13 comprises a second opening large enough to allow contact pads 30 of a tester loadboard 25 to pass through, with contact pads 30 of the loadboard 25 facing the interface socket, with a third multiplicity of second electrical contacts 35 having a first end and a second end extending through the second opening in the bottom structure 13, with the first ends of the second electrical contacts 35 arranged to meet with the second ends of the first electrical contacts 27 of the center structure 12, with the second ends of the second electrical contacts 35 arranged to meet with contact pads 30 of a tester loadboard 25, whereby the second multiplicity of first electrical contacts 27 equals the third multiplicity of second electrical contacts 35.

It will now be apparent to those skilled in the art, that other embodiments, improvements, details and uses can be made consistent with the letter and spirit of the present invention and within the scope of the present invention, which is limited only by the following claims, construed in accordance with the patent law, including the doctrine of equivalents.

What is claimed is:

1. An interface socket for ball grid array integrated circuit packages, said interface socket providing an interface between a device handler or a device tester and a device load board having contact pads, said interface socket comprising three structures, that is a top structure, a center structure and a bottom structure, said three structures further comprising:

said top structure comprising a first opening large enough to allow a grid array package to pass through with a first multiplicity of ball contacts facing said interface socket, said ball contacts having points of electrical contact;

said center structure comprising through holes through which a second multiplicity of first electrical contacts extend, each first electrical contact having a first end and a second end, with the first end of said first electrical contacts arranged to meet with the points of electrical contact of said contact balls, whereby said second multiplicity of first electrical contacts is equal to or larger than said first multiplicity of ball contacts;

said bottom structure comprising a second opening large enough to allow contact pads of a tester loadboard configuration to pass through, with contact pads of said loadboard facing said interface socket, with a third multiplicity of second electrical contacts having a first end and a second end extending through said second opening in said bottom structure, with the first ends of said second electrical contacts arranged to meet with the second ends of the first electrical contacts of the center structure, with the second ends of said second electrical contacts arranged to meet with contact pads of a tester loadboard, whereby said second multiplicity of first electrical contacts equals said third multiplicity of second electrical contacts.

2. An interface socket as in claim 1 wherein the sides of said opening in said top structure are chamfered, said chamfering structured to allow entering and positioning of said ball grid array integrated circuit packages.

3. The interface socket as in claim 1 where interconnection of said first end of said first electrical contacts of said center structure with points of electrical contact of said contact balls is by means of a interconnect electrical conductor with a surface structure that is shaped to position and stabilize contact balls and where each electrical contact of said first electrical contacts comprises a single unit structure of electrically conductive material.

4. The interface socket of claim 1 wherein said second opening within said bottom structure holds an elastomer.

5. The interface socket as in claim 1 where each of said second electrical contacts comprises at least one wire.

6. An interface socket for ball grid array integrated circuit packages, said interface socket providing an interface between a device handler or a device tester and a device loadboard having contact pads whose quantity of contact pads is a fourth plurality of contact pads, said interface socket comprising a top structure in addition to a center structure in addition to a bottom structure, said structures comprising:

said top structure being a relatively thin structure having opposed and essentially parallel surfaces, one of said surfaces being a second surface for receiving a Ball Grid Arrays (BGA) IC device having a first plurality of contact balls and the other surface being a first surface that is in contact with said center structure, said top structure comprising a first opening large enough to allow a BGA package to pass through with said first plurality of contact balls facing said center structure, said first plurality of contact balls having points of electrical contact;

said center structure being a relatively thin structure having opposed and essentially parallel first and second surfaces, said second surface of said center structure being in contact with said first surface of said top structure, said first surface of said center structure being in contact with said bottom structure, said center structure comprising a second opening through which a second multiple of first electrical contacts extends from said second surface of said center structure to said first surface of said center structure, each first electrical contact having a first end and a second end, with the first ends of said first electrical contacts arranged to meet with the points of electrical contact of said contact balls, whereby said second multiple of first electrical contacts equals or exceeds said first plurality of contact balls by a measurable amount;

said bottom structure being a relatively thin structure having opposed and essentially parallel first and second surfaces, said second surface of said bottom structure being in contact with said first surface of said center structure, said first surface of said bottom structure being in contact with said loadboard, said bottom structure comprising a third opening through which a third multiple of second electrical contacts extends from said second surface of said bottom structure to said first surface of said bottom structure, each second electrical contact having a first end and a second end, with the first ends of said second electrical contacts in said bottom structure arranged to meet with said second ends of said first electrical contacts in said center structure, whereby said second ends of said second electrical contacts in said bottom structure meet with said contact pads in said loadboard, whereby said third multiple of second electrical contacts equals said second multiple of first electrical contacts, whereby said third multiple of second electrical contacts equals said fourth plurality of contact pads in said loadboard.

7. The interface socket of claim 6 wherein said third opening in said bottom structure holds an elastomer.

8. The interface socket as in claim 6 where said first electrical contacts of said center structure comprise interconnect electrical conductors whereby said first end of said first electrical contacts have a surface structure that is shaped to position and stabilize contact balls and where each electrical conductor comprises a single unit structure of electrically conductive material.

9. The interface socket as in claim 6 where each of said second electrical contacts comprises at least one wire.

* * * * *